(12) United States Patent
Lien et al.

(10) Patent No.: US 7,474,011 B2
(45) Date of Patent: Jan. 6, 2009

(54) METHOD FOR IMPROVED SINGLE EVENT LATCH UP RESISTANCE IN AN INTEGRATED CIRCUIT

(75) Inventors: Chuen-Der Lien, Los Altos Hills, CA (US); Ta-Ke Tien, Cupertino, CA (US); Pao-Lu Louis Huang, San Jose, CA (US)

(73) Assignee: Integrated Device Technologies, inc., San Jose, CA (US)

( * ) Notice: Subject to any disclaimer, the term of this patent is extended or adjusted under 35 U.S.C. 154(b) by 164 days.

(21) Appl. No.: 11/527,374

(22) Filed: Sep. 25, 2006

(65) Prior Publication Data

US 2008/0122473 A1    May 29, 2008

(51) Int. Cl.
*H01L 27/00*   (2006.01)
*G06F 17/50*   (2006.01)

(52) U.S. Cl. .................. 257/929; 257/373; 257/491; 257/509; 257/546; 257/603; 716/4; 716/5; 716/7; 438/91; 438/380

(58) Field of Classification Search ............... 438/91, 438/380; 257/373, 491, 509, 546, 603, 929; 716/4, 5, 7
See application file for complete search history.

(56) References Cited

OTHER PUBLICATIONS

Tang, H. H. K., "Nuclear physics of cosmic ray interaction with semiconductor materials: Particle-induced soft errors from a physicist's perspective," *IBM J. Res. Develop.*, 40(1):91-108 (1996).

*Primary Examiner*—Thanh V Pham
(74) *Attorney, Agent, or Firm*—Finnegan, Henderson, et al.

(57) ABSTRACT

A process and system for estimating the occurrence of single event latch-up in an integrated circuit. The process involves determining the resistance between each junction and the closest appropriate tap in a regular shaped well. Each junction occurring in an irregular-shaped well is also identified. Finally, the method may make suggestions for lowering the probability that single event latch-up may occur in the integrated circuit.

17 Claims, 6 Drawing Sheets

METHOD FOR IMPROVED SINGLE EVENT LATCH UP RESISTANCE IN AN INTEGRATED CIRCUIT

BACKGROUND

1. Field of the Invention

The present invention relates to integrated circuits and, in particular, to detecting and preventing the effects of a single event latch-up in an integrated circuit.

2. Discussion of Related Art

A latch-up occurs when an unintended path is created in an integrated circuit by triggering a parasitic device within the integrated circuit ("IC"). A parasitic device may be inadvertently formed in any location of the integrated circuit by placing two or more devices in close proximity. For example, a parasitic device or structure may occur when a PNPN structure is inadvertently formed, resulting in a silicon-controlled rectifier (SCR). FIG. 1A, for example, shows an integrated circuit with a PNP/NPN structure that may inadvertently result in a parasitic device with a PNPN structure. In FIG. 1A, each PN junction may have a diode drop voltage of 0.6 V.

A single event latch-up (SEL) may be caused in an IC by a number of triggering events, such as, for example, the IC being subjected to cosmic rays and experiencing spikes of voltage on an input or output terminal. A triggering event may create free carriers in the substrate or in the wells of the IC. If the area of the substrate subjected to the triggering event exceeds the area of other components, such as wells, subjected to the triggering event, then the number of majority carriers generated in the substrate may be higher than the number of carriers generated in the other components. Because the majority carriers created in the substrate by the triggering event may outnumber the carriers created in other devices, not all majority carriers in the substrate may recombine, causing the majority carriers in the substrate to begin collecting in the substrate. As majority carriers collect in the substrate, the resulting current flow (I) in the substrate, which has a resistance r per unit distance, may create a voltage across the substrate from the junction to the substrate tap. If this voltage is greater than the diode drop voltage of the PN junctions, then an SCR may be inadvertently formed, possibly causing an SEL. FIG. 1B shows an example of the integrated circuit in FIG. 1A in which a PNPN junction has formed. Similar events may cause a parasitic device to form in a well on an IC.

The current flow caused by an SEL may damage the integrated circuit. For example, the excessive current caused by an SEL may flow through the created low-impedance path, possibly causing the circuit to be destroyed by the excessive current flow. Even if the SEL does not destroy the circuit, the device may have to be power-cycled to recover device functions. CMOS devices have inherent parasitic PNPN structures that are formed during fabrication of transistors in a semiconductor substrate. As technology trends towards developing smaller and higher performance integrated circuits, CMOS devices become more susceptible to SELs.

Testing for potential SEL sites is typically accomplished by scanning the circuit with neutron beams at an integrated repair operations center (IROC). At IROC, the circuit to be tested is placed under neutron beams and SELs are determined by counting the number of upsets that occur in the entire integrated circuit. The testing, however, can only indicate whether an SEL has occurred; it cannot detect where the SEL occurs in the integrated circuit unless the circuit is simultaneously functionally tested under the neutron beam using a test program. In addition to these drawbacks, the operator needs to know the layout of the circuit in order to determine the origin of the SEL. Moreover, the testing at IROC is costly and time consuming, and may require waiting for a period in which the facility is available for such testing (about twice a year); preparing the boards, hardware, and programming for testing at IROC may also require significant time.

SUMMARY

In accordance with the present invention, the present disclosure is directed to a method for predicting an occurrence of a single event latch-up in a circuit. In some embodiments, the method includes the steps of identifying a plurality of junctions and a corresponding tap for each of the junctions in the plurality of junctions in an integrated circuit; determining a first subset of the identified plurality of junctions; estimating a resistance to be associated with each junction in the first subset of identified plurality of junctions; identifying a second subset of identified plurality of junctions that includes each junction not in the first subset of identified plurality of junctions; and outputting the estimated resistance associated with each junctions in the first subset of identified plurality of junctions and a location to identify each junction in the second subset of identified plurality of junctions.

DETAILED DESCRIPTION

It is to be understood that both the foregoing general description and the following detailed description are exemplary and explanatory only and are not restrictive to the invention, as claimed. These and other embodiments are further discussed below with reference to the accompanying drawings, which are incorporated in and constitute a part of this specification.

Figure 1A:
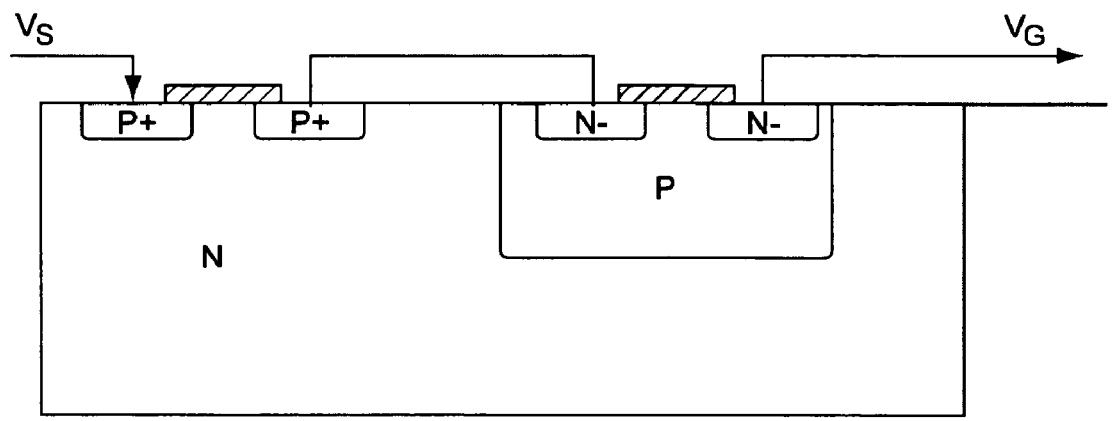
FIG. 1A shows an integrated circuit with a PNP/NPN structure that may inadvertently result in a parasitic device with a PNPN structure
Figure 1B:
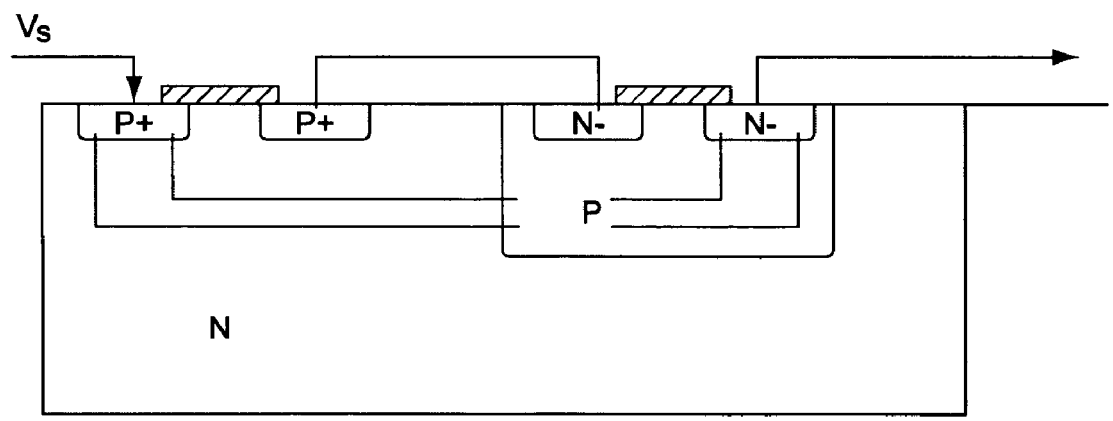
FIG. 1B shows an example of the integrated circuit in FIG. 1A in which a PNPN junction has formed.
Figure 2:
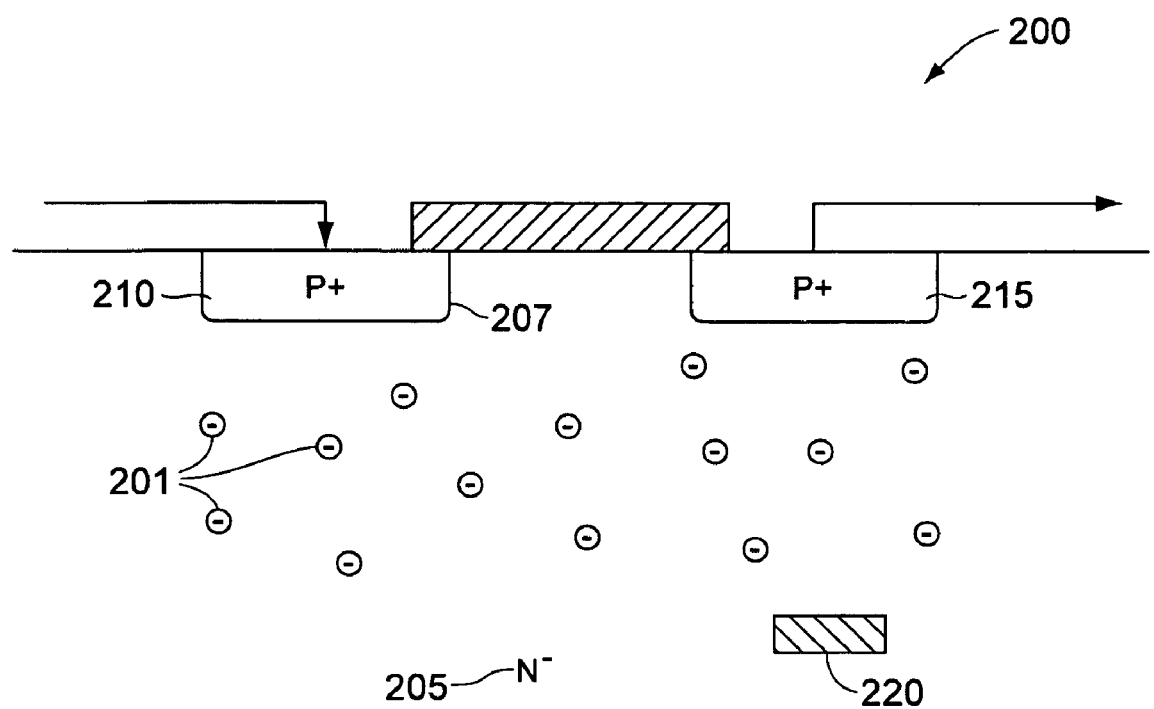
FIG. 2 shows a PNP structure in which a tap has been placed in the substrate to prevent the parasitic PNPN structure from forming.

FIG. 2 shows a PNP structure in which a tap has been placed in the substrate to prevent the parasitic PNPN structure from forming. As shown in FIG. 2, PNP structure 200 includes two P doped regions 210 and 215, N doped substrate 205, junction 207 between P doped region 210 and substrate 205, and substrate tap 220. When excess carriers are present in the substrate, a voltage may arise across substrate 205 as a function of the resistance of substrate 205 between junction 207 and tap 220. For example, during a triggering event, excess carriers 201 may collect in substrate 205 with some of excess majority carriers 201 occurring between junction 207 and tap 220, which is used to regulate the number of majority carriers 201 in substrate 205. As majority carriers accumulate in substrate 205, a current flow I may occur within substrate 205. Further, substrate 205 has a resistance per unit length, denoted as r, resulting in a resistance R between junction 207 and substrate tap 220. As current I begins to flow in substrate 205, a voltage V will arise between tap 220 and junction 207 equal to IR. If V exceeds the diode drop voltage for junction 207, then current may begin to flow from p-doped region 210 to n-doped region 205. Accordingly, substrates having a higher resistance R may be more susceptible to having IR exceed the diode drop for the junction and experiencing a single event latch-up. Moreover, as the distance between junction 207 and tap 220 increases, the value of R may also increase. The placement of the tap, therefore, may significantly influence the probability that SEL occurs.

Figure 3A:
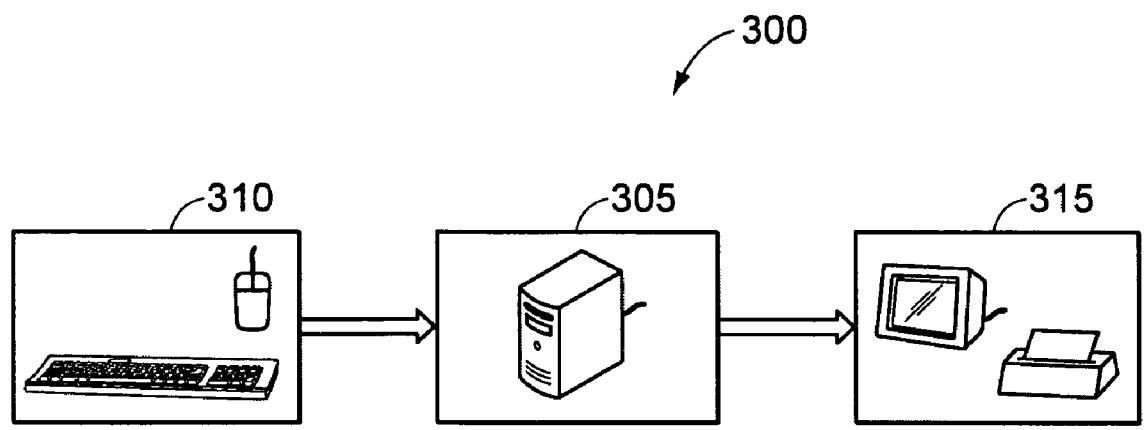
FIG. 3A shows an exemplary block diagram of an SEL estimating system for estimating the probability that SEL may occur in each junction in an integrated circuit.

FIG. 3A shows an exemplary block diagram of SEL estimating system 300 for estimating the relative likelihood that SEL may occur in each junction of an integrated circuit compared to the other junctions in the integrated circuit. As shown in FIG. 3A, one embodiment of a device for estimating the relative probability of each node suffering an SEL may include an estimating function 305, one or more data input devices 310, and one or more data output devices 315.

Figure 3B:
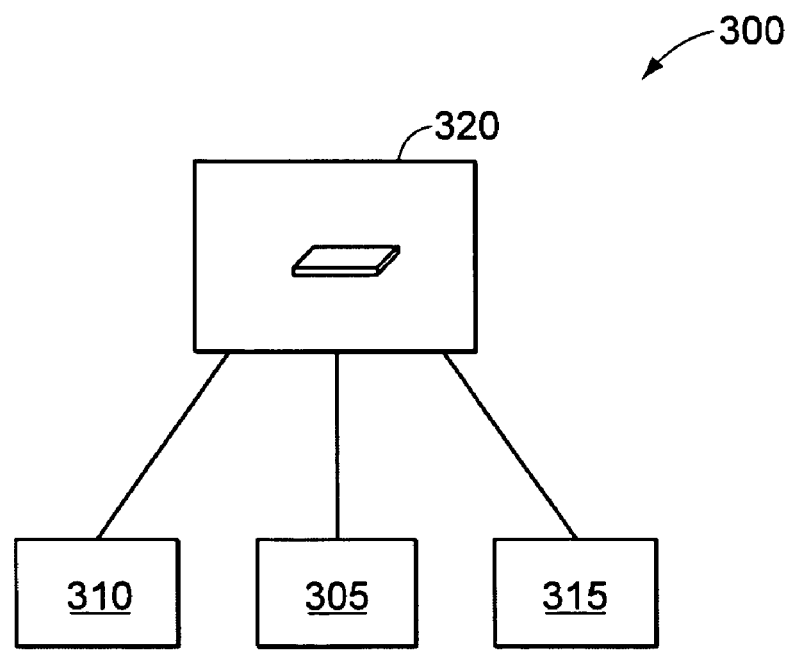
FIG. 3B shows in an exemplary embodiment of the present invention in which a processor controls input devices and output devices.

The actions of the different components of SEL estimating system 300 may be controlled in some embodiments by processor 320. As shown in FIG. 3B, in some embodiments, processor 320 may control input devices 310 and output devices 315. Processor 320 may control the execution of the algorithm used to estimate the relative likelihood of SEL occurring in one or more junctions of a circuit by executing estimating function 305. Processor 320 may be a central processing unit on a general or specific purpose computer. In some embodiments, the controlling processor may be an application specific integrated circuit. Multiple processors may control the components of SEL estimating system 300. One or more processors 320 may be used to estimate the probability that SEL will occur in each junction of an integrated circuit.

Referring to FIG. 3A, data input device 310 may include any device used for inputting the design of an integrated circuit into SEL estimating system 300. In some embodiments, data input device 310 may include computer programs used to input the integrated circuit design. For example, in some embodiments, a Verilog computer program, which is utilized in the design of integrated circuits, can be used to input an integrated circuit design into SEL estimating system 300. In some embodiments, a SPICE computer program, which is used in the design of integrated circuits, may be used to input the integrated circuit design into SEL estimating system 300. In some embodiments, such as the one shown in FIG. 3, more than one data input device 310 can be used to input the integrated circuit design into SEL estimating function 300.

After receiving the integrated circuit design, processor 320 may call and execute estimating function 305. Estimating function 305 receives the input integrated circuit design from data input device 310 and uses the input IC design to calculate the likelihood of an SEL event occurring on one or more junctions.

Figure 4:
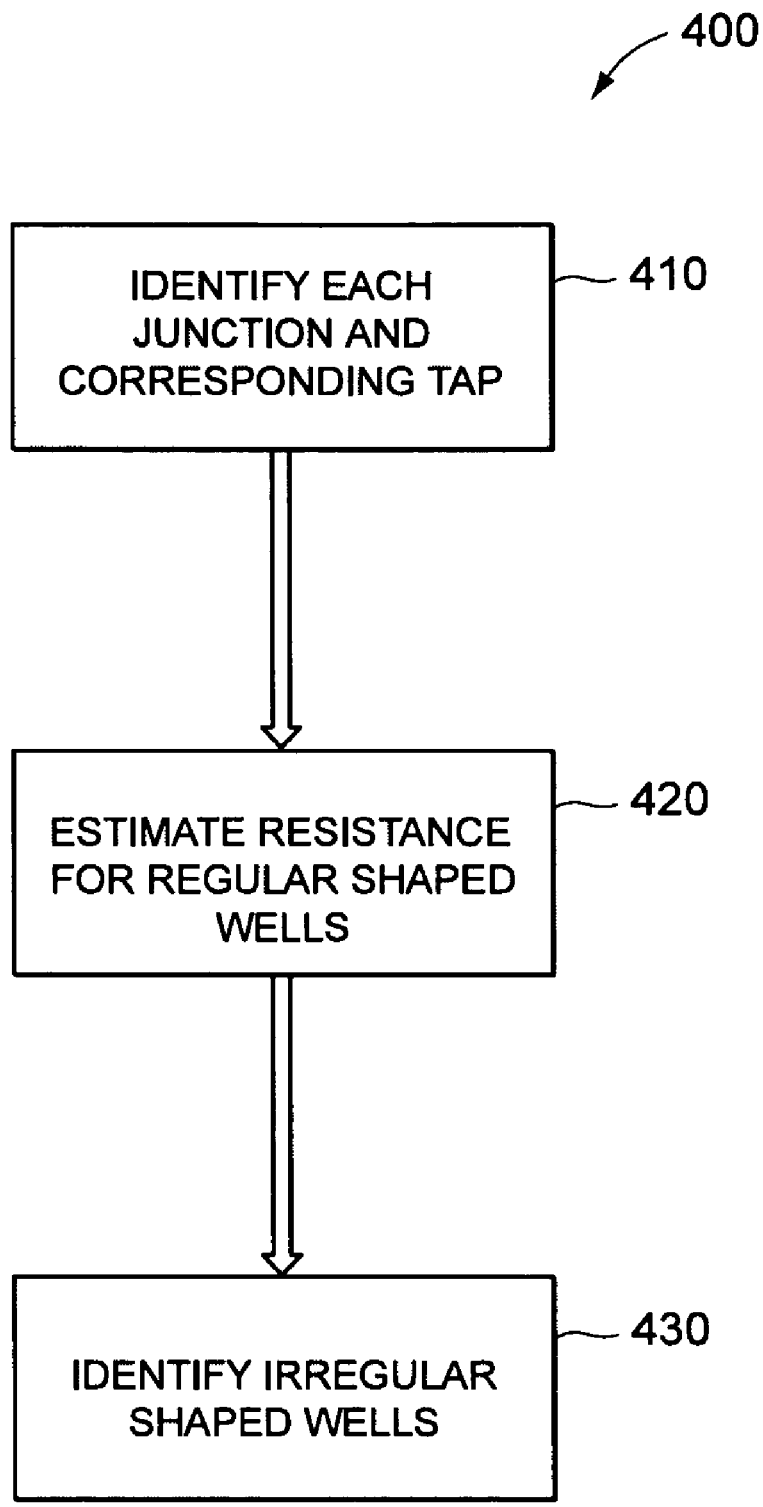
FIG. 4 shows an exemplary method according to the present invention to estimate the relative likelihood that SEL may occur in one or more junctions of an integrated circuit.

FIG. 4 shows an exemplary method for determining the relative likelihood that an SEL event may occur in a plurality of junctions in an IC. In some embodiments, estimating function 305 may use the method shown in FIG. 4 to estimate the relative probability of SEL occurring in a plurality of junctions on an IC. As shown in FIG. 4, method 400 includes step 410 of identifying each junction, and a corresponding tap, in the circuit; step 420 of estimating a resistance for each junction when the junction and the corresponding tap both occur in the same regular-shaped well; and step 430 of identifying each junction in which the junction and the corresponding tap both occur in an irregular shaped well in the integrated circuit. Estimating function 305 need not perform method 400 in the sequential order shown in FIG. 4. For example, estimating function 305 may perform step 430 in parallel with either or both of steps 410 and 420. In some embodiments, the steps 410 of identifying junctions and 420 of estimating a resistance for a junction may occur sequentially for each junction before process 400 identifies and estimates the resistance for the next junction.

In step 410 of method 400, each junction in the circuit is identified along with the corresponding tap for each junction. A junction refers to a p-n junction in the structure. A corresponding tap for a junction is the tap that drains excess carriers from the area of the well around the junction to prevent a parasitic structure from forming. In some embodiments, processor 320 may identify each junction in an integrated circuit using the schematic of the integrated circuit input by the user. The corresponding tap for a junction occurring in a well may be identified from the input schematic by identifying the tap in the well closest to the identified junction.

Figure 5:
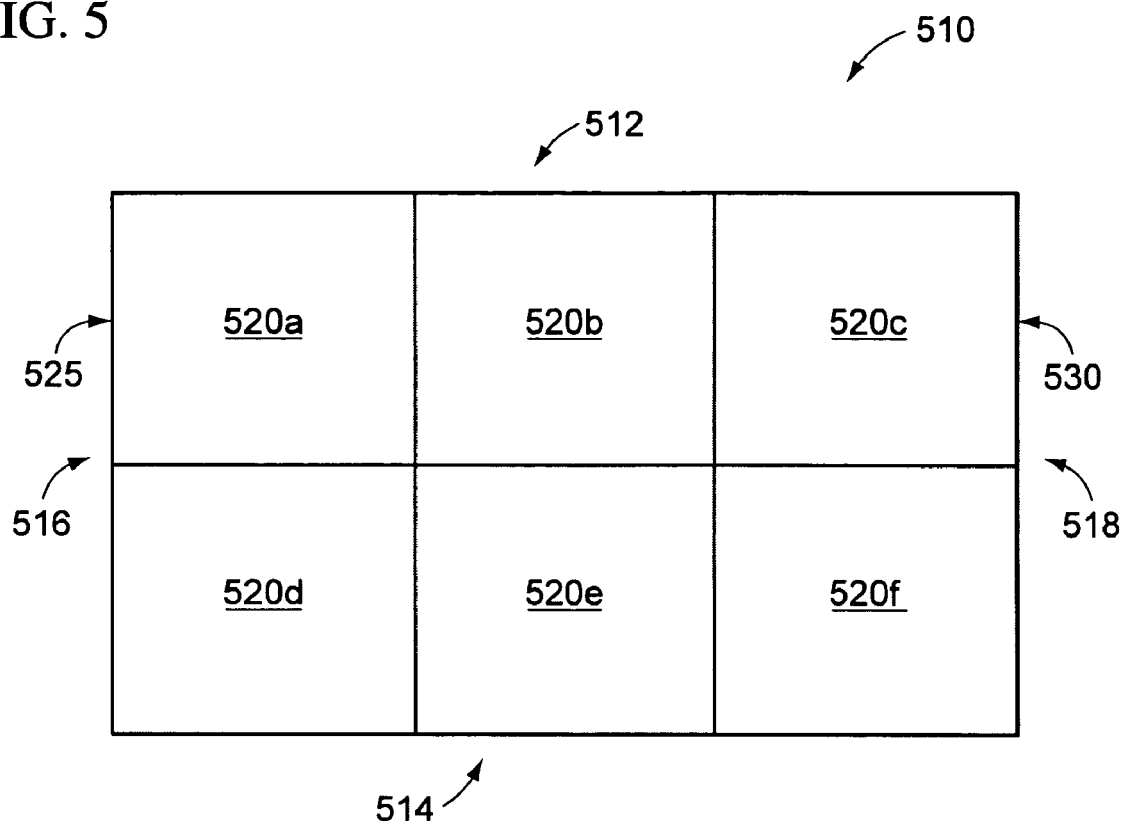
FIG. 5 shows an exemplary embodiment of a regular shaped well containing a junction and a tap.

In step 420 of method 400, a resistance for some of the junctions may be estimated. In some embodiments, the resistance between the junction and its corresponding tap may be estimated if the junction and the corresponding tap are separated by a regular-shaped well. FIG. 5 shows an exemplary embodiment of a regular-shaped well. As seen in FIG. 5, regular-shaped well 510 has a rectangular shape and contains tap edge 530 and junction edge 525. In the exemplary embodiment shown in FIG. 5, sides 512 and 514 of regular-shaped well 510 both have a length of about 3 microns. Sides 516 and 518 in exemplary regular-shaped well 510 have a length of about 2 micron. In some embodiments, sides 512 and 514 may be longer or shorter than 3 microns, while sides 516 and 518 may be longer or shorter than 2 micron. In some embodiments, sides 512, 514, 516, and 518 may each be of the same length to form a square. In the exemplary embodiment shown in FIG. 5, regular-shaped well 510 may be doped with different materials, such as Boron for a p-well and Phosphorous for an n-well.

In some embodiments, the resistance of regular-shaped well 510 between tap edge 530 and junction edge 525 may be estimated by using the squares 520a-f present in regular-shaped well 510. The size of a square may vary as long as the well sheet resistance for a square is known. To calculate the total resistance between junction edge 525 and tap edge 530, the resistance for one square is multiplied by the number of squares between junction edge 525 and tap edge 530. For example, regular-shaped well 510 may consist of 6 squares 520a-f measuring 1 micron by 1 micron. When regular-shaped well 510 has been formed by using Boron as the doping material, the resistance of one 1 micron by 1 micron square 520 may be known to be 500 ohms. Because three squares 520a-c separate junction edge 525 and tap edge 530, the total resistance between junction edge 525 and tap edge 530 is 1500, three times the resistance of single square 520a.

Figure 6:
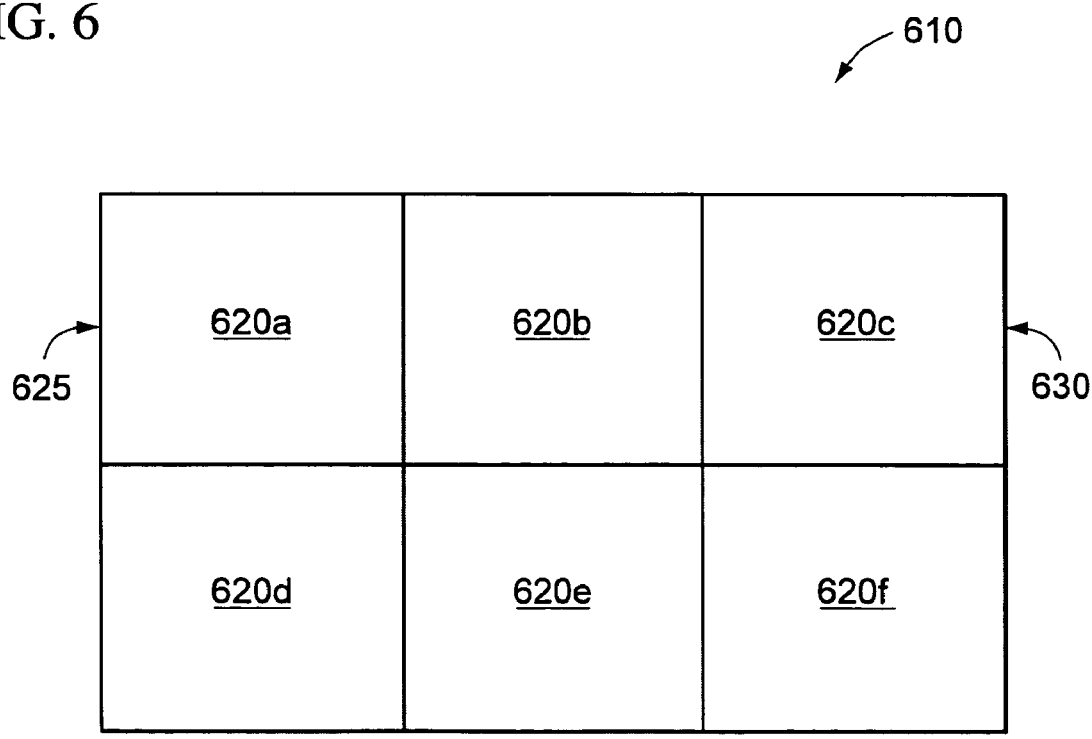
FIG. 6 shows an exemplary embodiment of a regular shaped well containing two taps.

In some embodiments of SEL estimating system 300, the calculated resistance for step 420 may be an estimate of the resistance between two taps. The same method of calculating the resistance between a junction and a well tap may also be used to calculate the resistance between two taps occurring in a regular-shaped well. FIG. 6 shows an exemplary embodiment of a well containing two taps and divided into six squares 620a-f measuring one micron by one micron. Well 610 may be doped with different materials, such as Boron for a p-well and Phosphorous for an n-well. The exemplary embodiment shown in FIG. 6 is doped with Boron, which has a resistance of 500 ohms for each square 620a-f. To calculate the total resistance between tap edge 625 and tap edge 630, the resistance for one square is multiplied by the number of squares between tap edge 625 and tap edge 630. For example, regular-shaped well 610 may consist of 6 squares 620a-f measuring 1 micron by 1 micron. The resistance of one 1 micron by 1 micron square 620 doped with Boron may be known to be 500 ohms. Because three squares 620a-c separate tap 625 and tap 630, the total resistance between junction edge 625 and tap edge 630 is 1500, three times the resistance of single square 620a.

Some embodiments of SEL estimating system 300 may use both the junction-to-tap estimation method and the tap-to-tap estimation method to complete step 420 in method 400. The decision of which method to use may involve a design choice. For example, compared to the tap-to-tap method, the junction-to-tap estimation method may provide for a more accurate estimate of the resistance between a junction and a tap. This increased accuracy may allow for fewer overall taps to be placed in the IC. The junction-to-tap estimation method, however, may require more processing time and resources to complete to account for the placement of each junction. Accordingly, the tap-to-tap estimation method may require fewer processing resources to complete.

Figure 7:
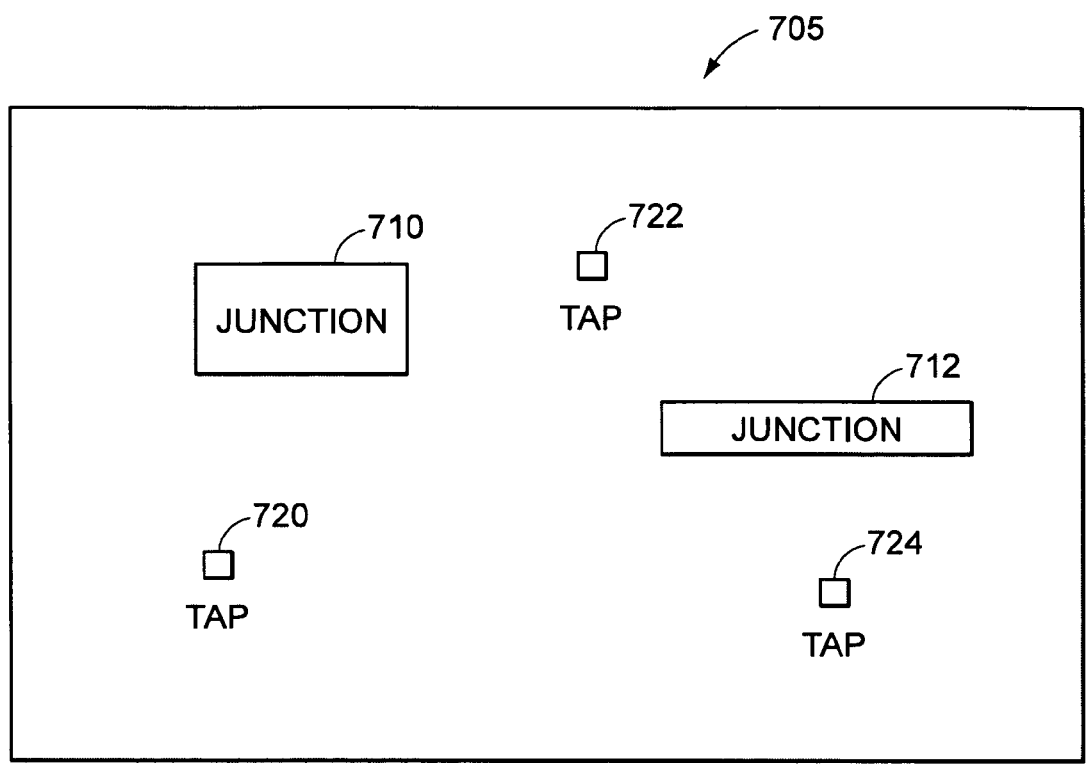
FIG. 7 shows an embodiment of an irregular shaped well.

FIG. 7 shows an embodiment of an irregular shaped well. The exemplary irregular shaped well 705 depicted in FIG. 7 has junction 710, junction 712, tap 720, tap 722, and tap 724. As shown in exemplary irregular shaped well 705, junctions 710-712 and taps 720-724 may be placed within any location of irregular shaped well 705, thus forming an irregular shaped well. In some embodiments of an irregular shaped well, junctions 710-712 and taps 720-724 may have different shapes. In step 430, the method identifies each junction and corresponding tap occurring in an irregular shaped well within the integrated circuit. An irregular shaped junction is not rectangular and cannot be divided into squares. The resistance between a tap and a junction or the resistance between two taps may be calculated when occurring in an irregular-shaped well. Making this calculation, however, may involve solving a complex equation, as described in "Two and Three Dimensional Calculation of Substrate Resistance" in IEEE Transactions on Electron Devices, Vol. 35, No. 3, March 1988; and "Fast Computation of Substrate Resistances in Large Circuits" in IEEE European Design & Test Conference, 1996, both of which are hereby incorporated by reference. Because of the difficulty in making the calculation, time and monetary constraints may weigh against solving an equation for an irregular-shaped well. Accordingly, a value for the resistance between a tap and a junction or between two taps occurring in an irregular-shaped well may not be estimated. Instead, these junctions may be flagged for special consideration by the operator.

After estimating function 205 (FIG. 7) performs steps 410-430, processor 305 may cause the results to be displayed on output device 215. In some embodiments, for each junction for which processor 305 could estimate a resistance, output device 215 may output these junctions and the estimated resistance for the junction. Output device 215 may output each junction for which a resistance could not be estimated because of the occurrence of an irregular well. In some embodiments, processor 305 may order the output of each junction and the estimated resistance for the junctions. For example, processor 305 may output each junction occurring in a regular shaped well based on the resistance of each junction. The junctions may be output ranked in order according to the estimated resistance of a junction, with those junctions having a higher estimated resistance appearing higher in the rankings. Processor 305 may cause a graph, such as a bar graph, showing the resistance for each regular shaped junction to be displayed on output device 215.

Some embodiments of SEL estimating system 200 may suggest different actions to take that may lower the probability that SEL may occur in the integrated circuit. In some embodiments, SEL estimating system 200 may produce a list of junctions in the integrated circuit with the highest resistance values R along with suggested actions to take to reduce the probability that SEL may occur in these junctions. SEL estimating system 200 may produce a separate list in which junctions in irregular shaped wells are identified along with suggestions for lowering the probability that SEL may occur in these junctions because of a triggering event. These suggestions may come from known techniques used to lower the probability that SEL may occur in a junction. In some embodiments, the known techniques for reducing the probability that a particular junction will suffer SEL include increasing the number of taps in the substrate or well; placing a tap closer to the listed junction; allowing one or more openings in a deep well opposite a well in which majority carriers may build up from a triggering event; allowing a well in which majority carriers may build up from a triggering event to not be fully sealed by an opposite deep well; and adding guard rings to prevent a possible parasitic structure. Some embodiments of estimating system 200 may take as additional input from input device 210 a resistance value that the user desires each junction in a regular-shaped well in the integrated circuit to possess. For example, the operator may wish for the resistance between a junction and its corresponding tap to be less than 1.5 k$\Omega$. Estimating function 200 may then produce on output device 215 a list of junctions that exceed the threshold resistance and suggestions for lowering the SEL probability.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of predicting an occurrence of a single event latch-up in a circuit, the method comprising:
    identifying a plurality of junctions and a corresponding tap for each of the plurality of junctions in an integrated circuit;
    determining a first subset of the identified plurality of junctions;
    estimating a resistance to be associated with each junction in the first subset of identified plurality of junctions;
    identifying a second subset of identified plurality of junctions that includes each junction not in the first subset of identified plurality of junctions; and
    outputting the estimated resistance associated with each junction in the first subset of identified plurality of junctions and a location to identify each junction in the second subset of identified plurality of junctions.

2. The method of claim 1, further comprising:
    ranking each junction in the first subset of identified plurality of junctions in the circuit as a function of the estimated resistance of each of the plurality of junctions.

3. The method of claim 1, wherein the junctions in the first subset of identified plurality of junctions includes the junctions occurring in a regular-shaped well, wherein the corresponding taps for each junction occurs in the same regular-shaped well.

4. The method of claim 1, wherein the step of estimating a resistance is accomplished, at least in part, by estimating a resistance between the junction and the corresponding tap.

5. The method of claim 1, wherein the step of estimating a resistance is accomplished, at least in part, by estimating a resistance between two taps.

6. The method of claim 2, further comprising:
reducing the probability of a single event latch-up occurring in one or more of the ranked junctions, wherein the one or more ranked junctions is chosen based, at least in part, on the estimated resistance for the junctions in the first subset of identified plurality of junctions.

7. The method of claim 6, wherein the one or more ranked junctions includes junctions having a resistance above a certain threshold value.

8. The method of claim 7, wherein a user defines the threshold value.

9. The method of claim 6, wherein the step of reducing the probability of a single event latch-up is accomplished by performing at least one of the following on at least one of the one or more ranked junctions in the first subset of identified plurality of junctions:
allowing an opening in a deep well;
adding additional taps to the substrate or well; and
adding additional dopants to the substrate to form a guard ring.

10. A computer-readable medium encoded with a computer program for predicting an occurrence of a single event latch-up in a set of junctions in a circuit, the computer program comprising:
instructions for identifying a plurality of junctions and a corresponding tap for each of the identified plurality of junctions in an integrated circuit;
instructions for determining a first subset of the identified plurality of junctions;
instructions for estimating a resistance to be associated with each junction in the first subset of identified plurality of junctions;
instructions for identifying a second subset of identified plurality of junctions that includes each junction not in the first subset of identified plurality of junctions; and
instructions for outputting the estimated resistance to be associated with each junction in the first subset of identified plurality of junctions and a location to identify each junction in the second subset of identified plurality of junctions.

11. The computer-readable medium of claim 10, further comprising:
instructions for ranking each junction in the first subset of identified plurality of junctions in the circuit as a function of the estimated resistance of each junction.

12. The computer-readable medium of claim 10, wherein the junctions in the first subset of identified plurality of junctions includes the junctions occurring in a regular-shaped well, wherein the corresponding taps of the junctions occur in the same regular-shaped well.

13. The computer-readable medium of claim 10, wherein the instructions for estimating a resistance is accomplished, at least in part, by estimating a resistance between the junction and the corresponding tap.

14. The computer-readable medium of claim 10, wherein the instructions for estimating a resistance is accomplished, at least in part, by estimating a resistance between two taps.

15. The computer-readable medium of claim 11, further comprising:
instructions for reducing the probability of a single event latch-up occurring in one or more of the ranked junctions, wherein the one or more ranked junctions is chosen based, at least in part, on the estimated resistance for the junctions in the first subset of identified plurality of junctions.

16. The computer-readable medium of claim 15, wherein the one or more ranked junctions includes junctions having a resistance above a certain threshold value.

17. The computer-readable medium of claim 16, further comprising instructions for accepting input from a user to define the threshold value.

* * * * *